United States Patent
Kim et al.

(10) Patent No.: US 6,308,112 B1
(45) Date of Patent: Oct. 23, 2001

(54) METHOD FOR CONTROLLING EMERGENCY STATES OF SEMICONDUCTOR FABRICATING EQUIPMENT ARRANGED IN A PROCESSING LINE

(75) Inventors: Sung-geun Kim; Jong-hwa Park, both of Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/148,632

(22) Filed: Sep. 4, 1998

(30) Foreign Application Priority Data

Jan. 14, 1998  (KR) ............................................. 98-801

(51) Int. Cl.$^7$ ..................................................... G06F 19/00
(52) U.S. Cl. .............................. 700/245; 700/15; 700/18; 700/19; 700/121; 700/28; 700/31; 700/84; 700/181; 712/244; 382/149
(58) Field of Search ..................................... 700/121, 110, 700/15, 18, 19, 28, 30, 31, 84, 181; 382/149; 396/48; 712/244

(56) References Cited

U.S. PATENT DOCUMENTS

| | | | |
|---|---|---|---|
| 4,438,492 | * 3/1984 | Harmon, Jr. et al. | 712/244 |
| 4,829,445 | * 5/1989 | Burney | 700/230 |
| 5,162,986 | * 11/1992 | Graber et al. | 700/17 |
| 5,469,361 | * 11/1995 | Moyne | 700/95 |
| 5,862,054 | * 1/1999 | Li | 700/121 |
| 5,923,553 | * 7/1999 | Yi | 700/110 |
| 6,000,830 | * 12/1999 | Asano et al. | 700/121 |

OTHER PUBLICATIONS

Mozumder et al., "Statistical control of a plasma etch process" Semiconductor Manufacturing, IEEE Transactions on vol.: 7 1, pp. 1–11, 1994.*

* cited by examiner

Primary Examiner—William A. Cuchlinski, Jr.
Assistant Examiner—McDieunel Marc
(74) Attorney, Agent, or Firm—Jones Volentine, P.L.L.C.

(57) ABSTRACT

A method for controlling emergency states of equipment in a semiconductor fabrication system includes determining whether on-line communication has been restored between a host computer and semiconductor fabrication equipment after an interruption in communication. If on-line communication has been restored, post-restoration emergency state data are received automatically from the equipment. Then it is determined whether the post-restoration emergency state data indicate the equipment is in a warning state. If the post-restoration emergency state data indicate the warning state, it is determined whether the warning state is a critical state. If the warning state is the critical state, a key value of a variable ID corresponding to the equipment is changed to a value indicative of shutting down the equipment. Then the equipment is shut down by inserting the variable ID into an equipment control message and downloading the equipment control message to the equipment. As a result, unforeseen operational problems can be prevented in advance and the work load of the operator can be considerably reduced.

9 Claims, 2 Drawing Sheets

METHOD FOR CONTROLLING EMERGENCY STATES OF SEMICONDUCTOR FABRICATING EQUIPMENT ARRANGED IN A PROCESSING LINE

BACKGROUND OF THE INVENTION

1. Field of the Invention

The present invention relates to a method for controlling equipment arranged in a semiconductor fabrication processing line with an on-line management system and, more particularly, to a method for automatically responding to emergency states of semiconductor fabricating equipment after an interruption in the on-line communication has been restored, through an emergency state monitoring module.

2. Description of the Related Art

Generally, the fabrication of semiconductor devices involves highly precise processes that require finely tuned precision equipment. Several pieces of precision equipment are typically employed in sequence and arranged on a semiconductor processing line. The operation of each piece of precision equipment on the line is closely monitored by operators to maintain and enhance the efficiency of the processing line.

As shown in FIG. 1, conventional fabrication equipment 3 are disposed on a conventional processing line. When a lot 10 of workpieces, such as wafers, are introduced into the equipment 3, the equipment 3 performs a fabrication process on the lot. The equipment 3 is connected on-line to a host computer 1 through an equipment server (not shown). An operator interface (O/I) 2, for example an operator interface personal computer (O/I PC), is also connected on-line to the host computer 1. Through the O/I 2, an operator informs the host computer 1 that a process using the equipment 3 is about to commence. The operator inputs basic manufacture data, e.g., the identification number (ID) of the lot to be processed in the equipment 3 and the ID of the equipment 3 for performing the process with the lot, into the host computer 1.

Then, based on the input basic manufacture data, the host computer 1 searches its data base for the process condition data to be applied to the process on the lot. The host computer 1 immediately downloads these process condition data, including preset process settings, to the equipment. Process settings may include, for example, a desired process time duration or a desired process temperature.

Thereafter, the operator checks the process condition data and inputs a process commencing command or a process terminating command. The lot is then automatically and rapidly routed into and out of the equipment 3. In this manner, the process equipment 3 performs on the workpieces of each lot based on the process settings received.

If any emergency situation, such as operation troubles, occurs in the equipment 3 during the process with the lots 10, the equipment 3 immediately reports the emergency occurrence therein to the host computer 1. The host computer 1 then immediately informs the operator through the O/I 2 that the equipment 3 is in the emergency state. As a result, the operator can take action to handle the emergency and to restore the equipment 3 to the normal state.

However, such a conventional management system suffers from several problems. First, in the event that the on-line communication between the host computer 1 and the equipment 3 is interrupted for more than a certain amount of time, data transmissions between the host computer 1 and the equipment 3 are cut off, and equipment emergency states sent to the host computer 1 during this interval will not be received. Consequently, the emergency state of the equipment 3 recognized by the host computer 1 is the emergency state before the on-line communication was interrupted. After the on-line communication is restored, the emergency state recognized by the host computer 1 can not be considered accurate.

Secondly, in the event that an inaccurate emergency state is transmitted to the operator through the O/I 2, operational problems may occur that the operator can not foresee.

Thirdly, because the emergency state is not reliably accurate after the on-line communication is restored, the operator must check all the equipment one by one to accurately recognize whether any emergency situation has occurred. This results in increased work load for the operator and efforts diverted from other necessary duties.

SUMMARY OF THE INVENTION

It is therefore an object of the present invention to prevent unforeseen operational problems in advance by accurately recognizing emergency states of equipment in real time after the on-line communication between a host computer and the equipment is interrupted for a certain amount of time and then restored.

It is another object of the present invention to considerably reduce the work load of the operator by automatically controlling the emergency states of the equipment without special equipment-checking tasks performed by the operator after the on-line communication between a host computer and the equipment is interrupted for a certain amount of time and then restored.

To achieve the above objects and other objects and advantages of the present invention, the method for controlling equipment in a semiconductor fabrication system includes determining whether on-line communication has been restored between a host computer and semiconductor fabrication equipment after an interruption in communication. If on-line communication has been restored, post-restoration emergency state data from the equipment are received automatically. It is then determined whether the post-restoration emergency state data indicate the equipment is in a warning state. If the post-restoration emergency state data indicate the warning state, it is determined whether the warning state is a critical state. If the warning state is the critical state, a key value of a variable ID corresponding to the equipment is changed to a value indicative of shutting down the equipment, and the equipment is shut down by inserting the variable ID into an equipment control message and downloading the equipment control message to the equipment.

In another aspect of the invention, the method also includes determining whether an introduction signal for introducing a lot into the equipment has been input, if the warning state is not the critical state. If the introduction signal has been input, a warning message is downloaded onto an on-line operator interface.

Therefore, the emergency states of the equipment arranged in a semiconductor fabrication, on-line management system can be controlled accurately even after the on-line communication between the host computer and the equipment is interrupted for a certain amount of time and then restored.

BRIEF DESCRIPTION OF THE DRAWINGS

The present invention is described in detail with reference to the accompanying drawings, in which.

DETAILED DESCRIPTION OF THE PREFERRED EMBODIMENTS

The present invention now will be described more fully hereinafter with reference to the accompanying drawings. In this specification, it is understood that equipment can refer to a stand-alone apparatus or a group of such apparatuses. It is also understood that the state of equipment can be the value of a single parameter or an array of values corresponding to several parameters. It is also understood that any predetermined values can be provided in any number of conventional ways known to those of ordinary skill in the art, including, for example, an on-line storage device, a look-up-table, and manual input by an operator.

Figure 1:
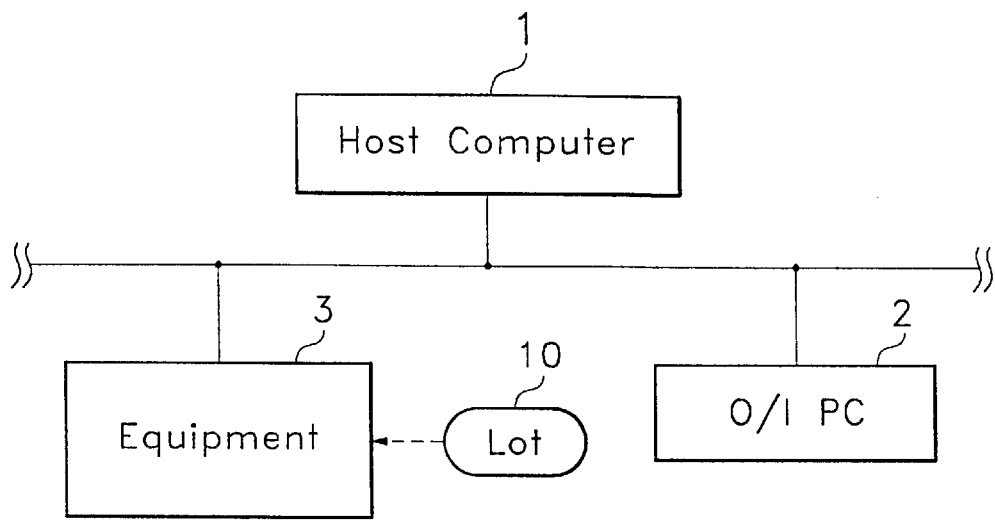
FIG. 1 is a schematic block diagram of a conventional controlling system for semiconductor manufacturing equipment in a processing line.
Figure 2:
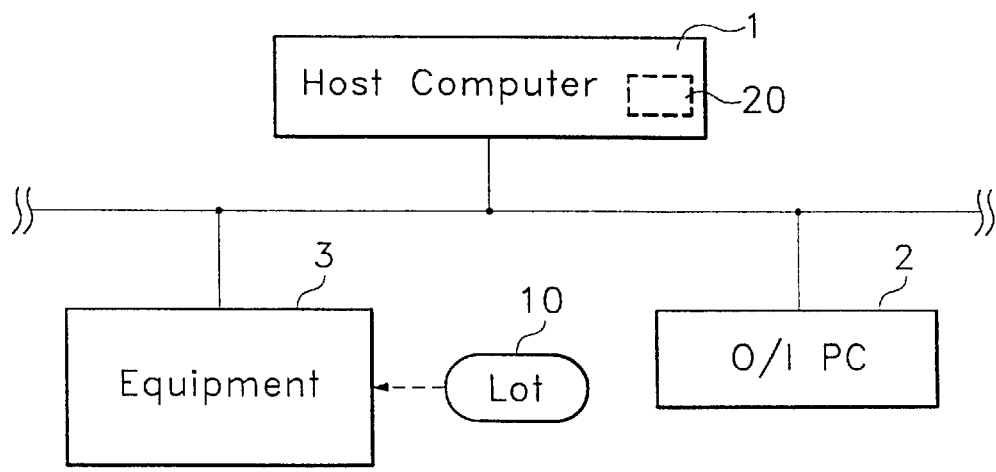
FIG. 2 is a schematic block diagram of a controlling system for semiconductor manufacturing equipment in a processing line using the present invention therein.

As shown in FIG. 2, a host computer 1 includes an emergency state monitoring module 20 which monitors emergency state data uploaded from equipment 3 after the on-line communication between the host computer 1 and the equipment 3 has been interrupted for a certain amount of time and then restored. When the emergency state monitoring module 20 is installed in the host computer 1, the equipment 3 are also provided with a reporting function so that the emergency state of the equipment 3 can be reported to the emergency state monitoring module 20 automatically, in real time. The emergency monitoring module 20 informs the operator of the emergency states of the equipment 3, or turns off any piece of equipment 3 in a critical emergency state to prevent lots 10 from being introduced into such equipment 3. An operator interface (O/I) 2, for example an operator interface personal computer (O/I PC), is also connected on-line to the host computer 1.

Figure 3:
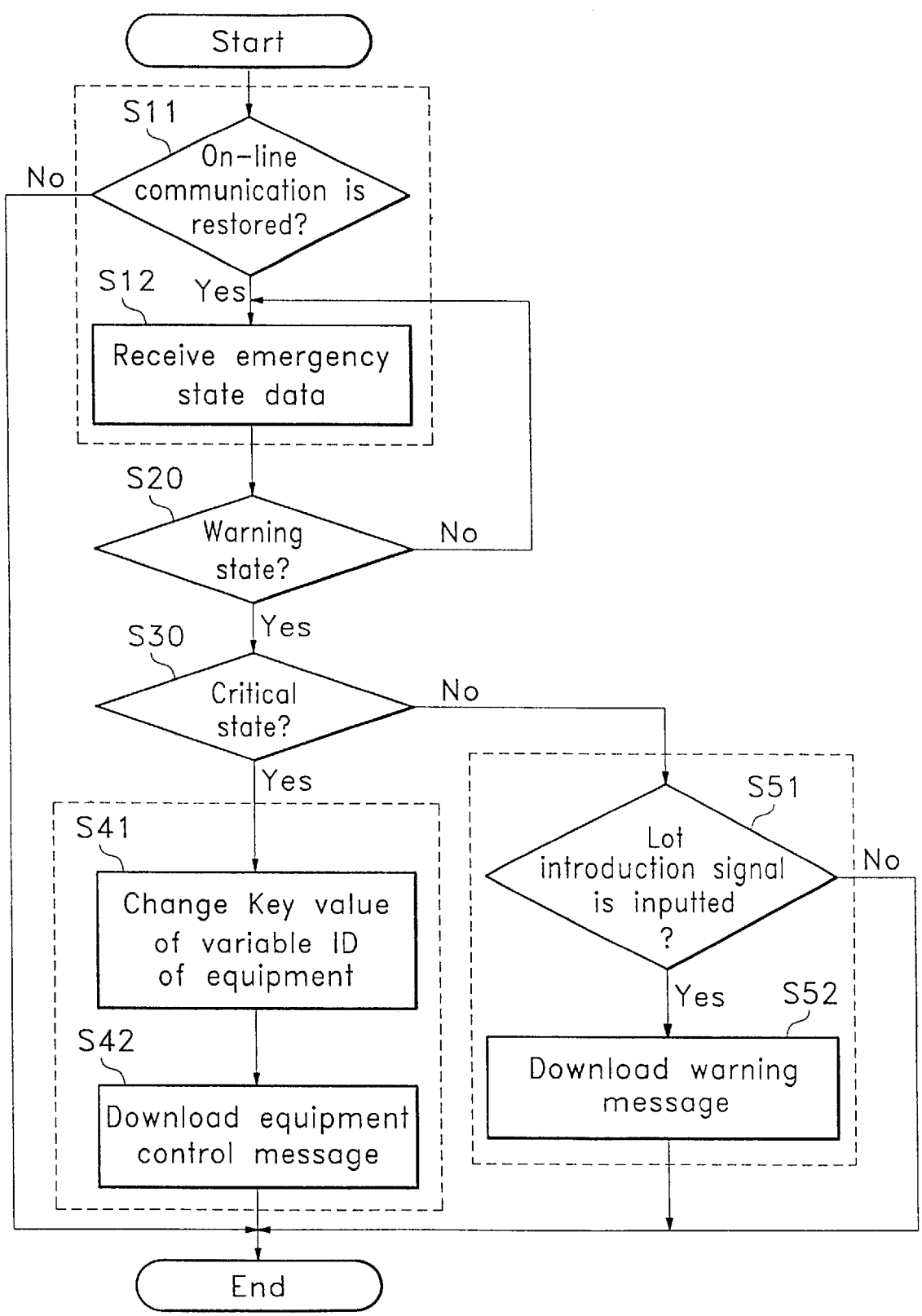
FIG. 3 is a flowchart of a method for automatically controlling emergency states after an interruption according to a preferred embodiment of the present invention.

Referring to FIG. 3, the method for controlling the emergency states of the equipment arranged in a semiconductor fabricating equipment management system according to the present invention will be described in more detail. First, the emergency state monitoring module 20 determines whether the on-line communication between the host computer 1 and the equipment 3 has been restored after an interruption, or not (S11). If it is determined that the on-line communication has not been restored after an interruption, the emergency state monitoring module 20 terminates the control process flow (block labeled "End"). In the preferred embodiment, during such termination, control is returned to S11.

Otherwise, if it is determined that the on-line communication has been restored after an interruption, the emergency state monitoring module 20 automatically receives post-restoration emergency state data uploaded from the equipment 3 through the equipment server in real time (S12). As a result, the actual emergency state of the equipment 3 can be recognized immediately by the emergency state monitoring module 20 after the on-line communication is restored. Then, the emergency state monitoring module 20 checks the post-restoration emergency state data to determine whether the data indicate that the equipment 3 is in the warning state or not (S20). If the post-restoration emergency state data indicate that the equipment 3 is not in the warning state, but in the run state, the control process flow returns to receiving post-restoration emergency state data S12. That is, step S12 is repeated, followed by another execution of step S20. This cycle can be repeated until the equipment 3 is found to be in the warning state during step S20.

If in S20 the post-restoration emergency state data indicate that the equipment 3 is in the warning state, the emergency state monitoring module 20 determines whether the warning state is a critical state or not (S30). The critical state indicates a higher degree of instability of the equipment 3 than do other warning states, so that shutting down the equipment 3 in the critical state is appropriate.

If the warning state is the critical state, i.e., that the equipment is in a severely unstable state, a key value of the equipment 3 identification parameter, i.e. the variable ID of the equipment 3, is put into the off state to indicate the equipment 3 should be shut down (S41). In the preferred embodiment, the emergency state monitoring module 20 transmits to the host computer 1 the determination that the post-restoration emergency state data indicate the critical state. In this embodiment, the host computer 1 then changes the key value of the variable ID of the equipment 3 into the off state. In the preferred embodiment, the variable ID changed by the host computer 1 is the Equipment Constant identification number (ECID) that is capable of changing the state of the equipment 3 to the off state. In this embodiment, the variable ID having the key value changed by the host computer 1 is transmitted to the emergency state monitoring module 20.

The emergency state monitoring module 20 loads the variable ID into an equipment control message, and downloads the equipment control message into the equipment 3 through the equipment server (S42). The equipment 3 is turned off immediately when the equipment control message is downloaded into the equipment 3.

According to the present invention, through the emergency state monitoring module 20, the host computer 1 can accurately recognize the actual emergency state of the equipment 3 even though the on-line communication has just been restored after an interruption. When it is subsequently determined that the equipment 3 is in the critical state, the host computer 1, through the emergency state monitoring module 20, turns off the equipment 3 to prevent equipment 3 in the critical state from processing lots 10. Accordingly, unforeseen operational problems associated with processing by equipment 3 in a critical state can be prevented in advance.

In the preferred embodiment, the equipment control message downloaded from the emergency state monitoring module 20 into the equipment 3 is a stream function message that allows smooth communication. Preferably, the stream function message format of the equipment control message is either S2F21 or S2F41, both of which are suitable for standard communications. For example, the emergency state monitoring module 20 of the preferred embodiment turns off the equipment 3 as follows. The emergency state monitoring module 20 receives from the host computer 1 an ECID having a key value changed to indicate the off state. Then the emergency state monitoring module 20 loads the ECID into a stream function message in S2F21 or S2F41 format. This stream function message is downloaded into the equipment 3. As a result of the changed key value of the ECID, the state of the equipment 3 is rapidly changed into the off state. Accordingly, unforeseen operational problems can be prevented in advance.

If it is determined in S30 that the warning state is not the critical state but just some other unstable state, the emergency state monitoring module 20 determines whether an introduction signal, indicating that a lot is to be introduced into the equipment, has been input by the operator through the O/I 2, e.g., the O/I PC 2, or not (S51). If the introduction signal has not been input into the O/I 2, the emergency state monitoring module 20 determines that the operator is not commencing the process using this equipment yet and the controlling process flow terminates. Again, in the preferred embodiment, during such termination, control is returned to determining whether on-line communication has been restored S11.

Otherwise, if in S51 the introduction signal has been input by the operator through the O/I 2, the emergency state monitoring module 20 determines that a lot 10 is to be introduced into the equipment 3 which is in an emergency state. The emergency state monitoring module 20 downloads a warning message with text so that the operator can visually recognize the non-critical emergency state of the equipment 3 (S52). The format of the warning message may vary with the O/I PC 2 in ways known to those of ordinary skill in the art.

For example, the emergency state monitoring module 20 processes the post-restoration emergency state data as text data and downloads a warning message with the text data, e.g., "The equipment is in the warning state. Please confirm routing the lot into the equipment." This text data is downloaded, for example, onto the O/I PC 2 so that the operator can recognize the emergency state of the equipment 3 and take appropriate remedial action. Accordingly, the lot 10 can be prevented from being accidently introduced into the equipment 3 in the emergency state by the operator.

According to this embodiment of the present invention, the host computer 1 accurately recognizes the emergency state of the equipment 3 through the emergency state monitoring module 20 and displays a warning message to call the operator's attention to the situation when a lot 10 is to be introduced into equipment 3 which is in the warning state. Thereby, unforeseen operational problems can be prevented.

The host computer 1 and emergency state monitoring module 20 may then repeatedly perform the above steps, which results in enhanced efficiency in controlling the emergency state monitoring of the equipment.

According to the present invention, the emergency state of the equipment 3 after the on-line communication is restored is automatically controlled through the emergency state monitoring module 20 without any equipment-checking tasks performed by the operator. This results in considerably reduced work load for the operator. And, as aforementioned, according to the present invention, the emergency state of the equipment can be automatically controlled thereby preventing unforeseen operational problems.

This invention has been described above with reference to the aforementioned embodiments. It is evident, however, that many alternatives, modifications and variations will be apparent to those having skill in the art in light of the foregoing description. For example, the present invention can be applied to various semiconductor manufacturing equipment which are arranged in a processing line and need reliable emergency state detection and control of the equipment. Accordingly, the present invention embraces all such alternatives, modifications and variations as fall within the spirit and scope of the appended claims and their equivalents.

What is claimed is:

1. A method for controlling equipment in a semiconductor fabrication system, the method comprising:

determining whether on-line communication has been restored between a host computer and semiconductor fabrication equipment after an interruption in communication;

automatically receiving post-restoration emergency state data from the equipment, if on-line communication has been restored;

determining whether the post-restoration emergency state data indicate the equipment is in a warning state;

if in the warning state, determining whether the warning state is a critical state;

if in the critical state, changing a key value of a variable ID corresponding to the equipment to a value indicative of shutting down the equipment;

shutting down the equipment, including inserting the variable ID into an equipment control message and downloading the equipment control message to the equipment whereby the equipment is turned off, after said changing the key value;

determining whether an introduction signal for introducing a lot into the equipment has been input, if the warning state is not the critical state; and downloading a warning message to an on-line operator interface, if the introduction signal has been input.

2. The method of claim 1, wherein, during said shutting down the equipment, the equipment control message is a stream function message.

3. The method of claim 2, wherein, during said shutting down the equipment, the stream function message is formatted as one of an S2F21 format and an S2F41 format.

4. The method of claim 1, wherein, during said changing a key value, the variable ID is an equipment constant identification number.

5. The method of claim 1, further comprising returning to said automatically receiving post-restoration emergency state data, if the post-restoration emergency state data do not indicate the warning state.

6. The method of claim 1, further comprising:

returning primarily to said determining whether on-line communication has been restored, if on-line communication has not been restored; and returning secondarily to said determining whether on-line communication has been restored, after said shutting down the equipment.

7. The method of claim 1, further comprising:

returning also to said determining whether on-line communication has been restored, if the introduction signal has not been input; and returning otherwise to said determining whether on-line communication has been restored, after said downloading a warning message.

8. A method for controlling equipment in a semiconductor fabrication system, the method comprising:

determining whether on-line communication has been restored between a host computer and semiconductor fabrication equipment after an interruption in communication;

automatically receiving post-restoration emergency state data from the equipment, if on-line communication has been restored;

determining whether the post-restoration emergency state data indicate the equipment is in a warning state;

if in the warning state, determining whether the warning state is a critical state;

if in the critical state, changing a key value of a variable ID corresponding to the equipment to a value indicative of shutting down the equipment;

shutting down the equipment, including inserting the variable ID into an equipment control message and downloading the equipment control message to the equipment whereby the equipment is turned off, after said changing the key value; and returning to said automatically receiving post-restoration emergency state data, if the post-restoration emergency state data do not indicate the warning state.

9. A method for controlling equipment in a semiconductor fabrication system, the method comprising:

determining whether on-line communication has been restored between a host computer and semiconductor fabrication equipment after an interruption in communication;

automatically receiving post-restoration emergency state data from the equipment, if on-line communication has been restored;

determining whether the post-restoration emergency state data indicate the equipment is in a warning state;

if in the warning state, determining whether the warning state is a critical state;

if in the critical state, changing a key value of a variable ID corresponding to the equipment to a value indicative of shutting down the equipment;

shutting down the equipment, including inserting the variable ID into an equipment control message and downloading the equipment control message to the equipment whereby the equipment is turned off, after said changing the key value;

returning primarily to said determining whether on-line communication has been restored, if on-line communication has not been restored; and returning secondarily to said determining whether on-line communication has been restored, after said shutting down the equipment.

* * * * *